United States Patent
Matsumura

(10) Patent No.: US 8,963,747 B2
(45) Date of Patent: Feb. 24, 2015

(54) DECODING APPARATUS, ENCODING APPARATUS, DECODING METHOD, AND ENCODING METHOD

(71) Applicant: Kabushiki Kaisha Toshiba, Tokyo (JP)

(72) Inventor: Atsushi Matsumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/101,637

(22) Filed: Dec. 10, 2013

(65) Prior Publication Data

US 2014/0159928 A1    Jun. 12, 2014

(30) Foreign Application Priority Data

Dec. 11, 2012  (JP) .................................. 2012-270288

(51) Int. Cl.
*H03M 7/40*    (2006.01)
*G06T 5/00*    (2006.01)
*H03M 7/30*    (2006.01)

(52) U.S. Cl.
CPC ................. *H03M 7/40* (2013.01); *G06T 5/001* (2013.01); *H03M 7/30* (2013.01)
USPC ........................................ 341/67; 375/240.23

(58) Field of Classification Search
CPC ............ H03M 7/40; H03M 7/30; H04N 7/50; H04N 7/26106; H04N 7/26244; G06T 5/001; G06T 9/005
USPC .................. 341/67, 65, 106, 60; 375/240.23; 382/167, 239, 245, 246
See application file for complete search history.

(56) References Cited

U.S. PATENT DOCUMENTS

| | | | |
|---|---|---|---|
| 6,356,312 B1 * | 3/2002 | Lyu | ............................... 348/512 |
| 7,894,532 B2 * | 2/2011 | Otsuka | ..................... 375/240.23 |
| 2001/0021226 A1 | 9/2001 | Hatano et al. | |
| 2002/0006162 A1 | 1/2002 | Nakao et al. | |
| 2002/0012394 A1 | 1/2002 | Hatano et al. | |

FOREIGN PATENT DOCUMENTS

| | | |
|---|---|---|
| JP | 2001-326931 | 11/2001 |
| JP | 2001-346215 | 12/2001 |
| JP | 2002-016929 | 1/2002 |
| JP | 2003-101416 | 4/2003 |

* cited by examiner

*Primary Examiner* — Joseph Lauture
(74) *Attorney, Agent, or Firm* — Nixon & Vanderhye, P.C.

(57) ABSTRACT

According to an embodiment, a decoding apparatus includes a clipping unit and a decoding unit. The clipping unit is configured to clip pieces of encoded data each having a predetermined first code length from input data encoded with variable-length encoding. The predetermined first code length is greater than or equal to a maximum code length among a plurality of pieces of encoded data included in the input data. The decoding unit is configured to decode the clipped piece of encoded data by using variable-length decoding.

17 Claims, 16 Drawing Sheets

| delta_qp | ENCODED DATA | | | | | | CODE LENGTH |
|---|---|---|---|---|---|---|---|
| -4 | 0 | 0 | 0 | 0 | 1 | 0 | 6 |
| -3 | 0 | 0 | 0 | 1 | 0 | | 5 |
| -2 | 0 | 0 | 1 | 0 | | | 4 |
| -1 | 0 | 1 | 0 | | | | 3 |
| 0 | 1 | | | | | | 1 |
| 1 | 0 | 1 | 1 | | | | 3 |
| 2 | 0 | 0 | 1 | 1 | | | 4 |
| 3 | 0 | 0 | 0 | 1 | 1 | | 5 |
| 4 | 0 | 0 | 0 | 0 | 1 | 1 | 6 |

FIG.5

| RESIDUAL | CLIP DATA | | | | | |
|---|---|---|---|---|---|---|
| 0 | 1 | 0 | 1 | 1 | 0 | 0 | 0 |

FIG.6

| READ DATA | | | | | | delta_qp | CLIP LENGTH |
|---|---|---|---|---|---|---|---|
| 0 | 0 | 0 | 0 | 1 | 0 | -4 | 6 |
| 0 | 0 | 0 | 1 | 0 | X | -3 | 5 |
| 0 | 0 | 1 | 0 | X | X | -2 | 4 |
| 0 | 1 | 0 | X | X | X | -1 | 3 |
| 1 | X | X | X | X | X | 0 | 1 |
| 0 | 1 | 1 | X | X | X | 1 | 3 |
| 0 | 0 | 1 | 1 | X | X | 2 | 4 |
| 0 | 0 | 0 | 1 | 1 | X | 3 | 5 |
| 0 | 0 | 0 | 0 | 1 | 1 | 4 | 6 |

FIG.7

| READ DATA | | | | | | | | delta_qp | CLIP LENGTH |
|---|---|---|---|---|---|---|---|---|---|
| 2 | 0 | 0 | 0 | 0 | 1 | 0 | | -4 | 6 |
| 3 | 0 | 0 | 0 | 0 | 1 | 1 | | 4 | 6 |
| 4 | 0 | 0 | 0 | 1 | 0 | 0 | | -3 | 5 |
| 5 | 0 | 0 | 0 | 1 | 0 | 1 | | -3 | 5 |
| 6 | 0 | 0 | 0 | 1 | 1 | 0 | | 3 | 5 |
| 7 | 0 | 0 | 0 | 1 | 1 | 1 | | 3 | 5 |
| . | | | | | | | | | |
| . | | | | | | | | | |
| . | | | | | | | | | |
| 32 | 1 | 0 | 0 | 0 | 0 | 0 | | 0 | 1 |
| 33 | 1 | 0 | 0 | 0 | 0 | 1 | | 0 | 1 |
| 34 | 1 | 0 | 0 | 0 | 1 | 0 | | 0 | 1 |
| . | | | | | | | | | |
| . | | | | | | | | | |
| . | | | | | | | | | |
| 63 | 1 | 1 | 1 | 1 | 1 | 1 | | 0 | 1 |

FIG.8

| RESIDUAL | | | | |
|---|---|---|---|---|
| 1 | 1 | 0 | 0 | 0 |

| READ DATA | | | | | | delta_qp | CLIP LENGTH |
|---|---|---|---|---|---|---|---|
| 0 | 0 | 0 | 0 | 1 | - | -4 | 6 |
| 0 | 0 | 0 | 1 | 0 | - | -3 | 5 |
| 0 | 0 | 1 | 0 | X | - | -2 | 4 |
| 0 | 1 | 0 | X | X | - | -1 | 3 |
| 1 | X | X | X | X | - | 0 | 1 |
| 0 | 1 | 1 | X | X | - | 1 | 3 |
| 0 | 0 | 1 | 1 | X | - | 2 | 4 |
| 0 | 0 | 0 | 1 | 1 | - | 3 | 5 |
| 0 | 0 | 0 | 0 | 1 | - | 4 | 6 |

FIG.22

| PACKET #0 | | | PACKET #1 | | | | |
|---|---|---|---|---|---|---|---|
| ENCODED DATA A #0 | ENCODED DATA A #1 | EN-CODED DATA A #2a | ENCODED DATA B #0 | EN-CODED DATA A #2b | ENCODED DATA A #3 | padding | ENCODED DATA B #1 | ENCODED DATA B #2 |

FIG.23

| PACKET #0 | | | | PACKET #1 | | |
|---|---|---|---|---|---|---|
| ENCODED DATA A #0 | ENCODED DATA A #1 | EN- CODED DATA A #2a | ENCODED DATA B #0 | ENCODED DATA B #1 | EN- CODED DATA A #2b | ENCODED DATA A #3 | padding | ENCODED DATA B #2 |

DECODING APPARATUS, ENCODING APPARATUS, DECODING METHOD, AND ENCODING METHOD

CROSS-REFERENCE TO RELATED APPLICATION

This application is based upon and claims the benefit of priority from Japanese Patent Application No. 2012-270288, filed on Dec. 11, 2012; the entire contents of which are incorporated herein by reference.

FIELD

Embodiments described herein relate generally to a decoding apparatus, an encoding apparatus, a decoding method, and an encoding method.

BACKGROUND

For image data encoding methods, fixed-length encoding and variable-length encoding are known. A code length of compressed data in the fixed-length encoding is fixed. A code length of compressed data in the variable-length encoding is not fixed. For example, it is known that in MPEG-2 which is an encoding scheme, the quantization parameter can be set in the range from 0 to 31, and 5-bit fixed-length encoding is performed. In addition, an encoding scheme such as H.264 is known to adopt variable-length encoding.

When variable-length encoding is performed, encoded data with a higher compression ratio compared to fixed-length encoding can be obtained. However, it is known that it takes more time to decode encoded data obtained by variable-length encoding than to decode encoded data obtained by fixed-length encoding. On the other hand, encoded data obtained by fixed-length encoding has a shorter processing time required upon decoding compared to variable-length encoding, but is known to have low compression ratio efficiency.

In addition, there is disclosed a technique for dividing encoded data having been subjected to variable-length encoding into fixed-length packets with a high level of importance and fixed-length packets with a low level of importance, and retransmitting the packets with a high level of importance upon transmission failure.

However, conventionally, it is difficult to perform high-speed decoding of encoded data having been subjected to variable-length encoding.

BRIEF DESCRIPTION OF THE DRAWINGS

FIG. 5 is a schematic diagram of stored data;
FIG. 6 is a schematic diagram of a data structure of a lookup table;
FIG. 7 is a schematic diagram of a data structure of a lookup table;
FIG. 8 is a schematic diagram of stored data;
FIG. 22 is a schematic diagram of a data structure of output data;
FIG. 23 is a schematic diagram of a data structure of output data.

DETAILED DESCRIPTION

According to an embodiment, a decoding apparatus includes a clipping unit and a decoding unit. The clipping unit is configured to clip pieces of encoded data each having a predetermined first code length from input data encoded with variable-length encoding. The predetermined first code length is greater than or equal to a maximum code length among a plurality of pieces of encoded data included in the input data. The decoding unit is configured to decode the clipped piece of encoded data by using variable-length decoding.

First Embodiment

Figure 1:
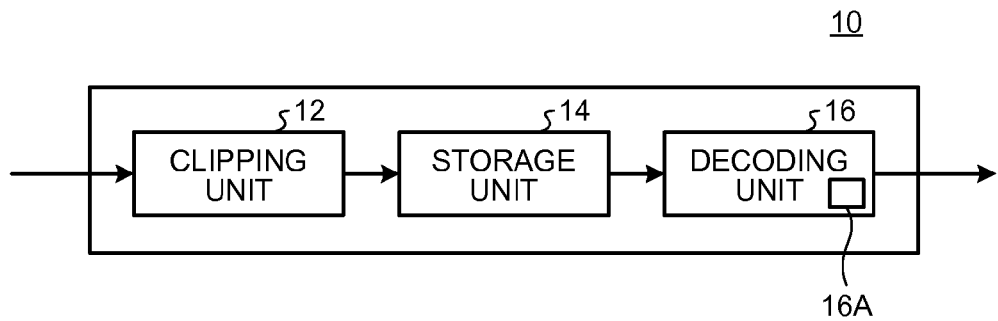
FIG. 1 is a block diagram of a decoding apparatus.

FIG. 1 is a block diagram illustrating a decoding apparatus 10 of the present embodiment. The decoding apparatus 10 is an apparatus that performs image decoding. The decoding apparatus 10 is mainly incorporated in, for example, an apparatus or system that handles CG (Computer Graphics) images, such as a screen of a PC (Personal Computer).

The decoding apparatus 10 is incorporated in an apparatus that is implemented by hardware such as an image decoding LSI (Large Scale Integration). By performing high-speed decoding by a decoding process by the decoding apparatus 10, for example, the display responsiveness of a display can be enhanced.

The decoding apparatus 10 of the present embodiment accepts input data to be decoded, decodes the data, and outputs the decoded data.

The input data accepted by the decoding apparatus 10 contains a plurality of pieces of encoded data having been subjected to variable-length encoding. The encoded data represents data obtained by variable-length encoding performed by an encoding apparatus (details will be described later). Examples of the encoded data include differences between quantization parameters and motion vectors, but the encoded data is not limited thereto.

The decoding apparatus 10 includes a clipping unit 12, a storage unit 14, and a decoding unit 16.

The clipping unit 12 clips input data accepted by the decoding apparatus 10, every predetermined first code length.

The first code length has a value greater than or equal to the maximum code length among the code lengths of a plurality of pieces of encoded data contained in the accepted input data. The maximum code length indicates the maximum value among code lengths that can be taken when the input data is subjected to variable-length encoding. The maximum code length is determined by a technique for variable-length encoding to be used, etc. In addition, the first code length has a value less than or equal to the data length of the input data. Note that it is assumed that the first code length is predetermined for each input data to be accepted by the decoding apparatus 10, and is prestored in a memory, etc. (not shown) of the decoding apparatus 10.

For example, it is assumed that the data length of input data is X bits (X is an integer greater than or equal to 1). In addition, it is assumed that the first code length is M bits (M is an integer between 1 and X, inclusive). In this case, the clipping unit 12 clips the input data every M bits which is the first code length. Note that in the following, the M bits which is the first code length may be simply referred to as the "first code length M" in description.

The storage unit 14 stores the clip data clipped by the clipping unit 12. The storage unit 14 is a known storage medium. The decoding unit 16 performs variable-length decoding of encoded data contained in the clip data. The decoding unit 16 includes a determining unit 16A. The determining unit 16A analyzes the data stored in the storage unit 14 (hereinafter, referred to as "stored data") to determine whether variable-length decoding based on the stored data can be performed.

Figure 2:
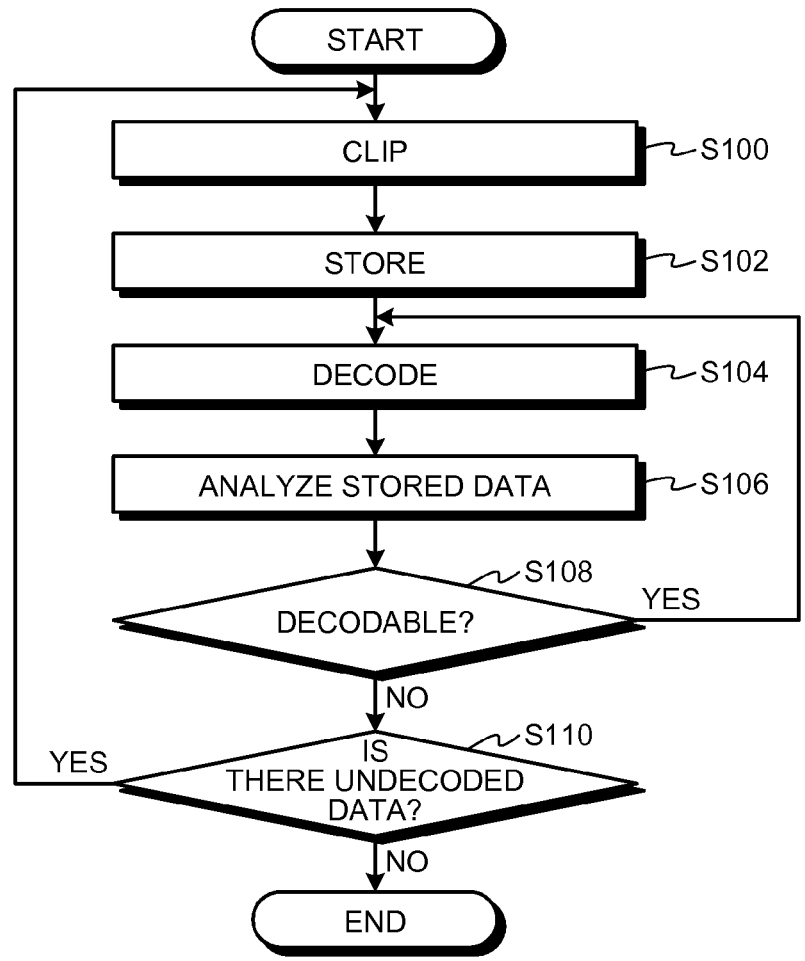
FIG. 2 is a flowchart illustrating a procedure of a decoding process.

FIG. 2 is a flowchart illustrating the procedure of a decoding process performed by the decoding apparatus 10.

When the decoding apparatus 10 accepts input data, the decoding apparatus 10 performs a decoding process illustrated in FIG. 2.

First, the clipping unit 12 clips the accepted input data every first code length (step S100). Then, the clipping unit 12 stores the clipped clip data in the storage unit 14 (step S102). Note that when data is stored in the storage unit 14, the clipping unit 12 stores the clip data in the storage unit 14 such that the newly clipped clip data is joined to the end of the data. Though details will be described later, the stored data indicates data remaining in the storage unit 14 that is part of clip data clipped by the clipping unit 12 and stored in the storage unit 14.

Then, the decoding unit 16 decodes encoded data contained in the stored data stored in the storage unit 14 (step S104) (details will be described later). Then, the decoding unit 16 outputs the decoded data. Note that the decoding unit 16 deletes the decoded, encoded data from the stored data in the storage unit 14. Hence, in the storage unit 14 there remains, as stored data, undecoded data having not been decoded yet that is part of the clip data stored in the storage unit 14 by the clipping unit 12.

Then, the determining unit 16A analyzes the stored data stored in the storage unit 14 (step S106) to determine whether variable-length decoding based on the stored data can be performed (step S108) (details will be described later).

If an affirmative determination is made at step S108 (step S108: Yes), processing returns to step S104.

On the other hand, if a negative determination is made at step S108 (step S108: No), processing proceeds to step S110. At step S110, the clipping unit 12 determines whether the input data to be decoded has undecoded data having not been decoded yet (step S110). The clipping unit 12 makes the determination at step S110 by, for example, determining whether all data contained in the input data has been clipped by the clipping unit 12.

If an affirmative determination is made at step S110 (step S110: Yes), processing returns to the above-described step S100. On the other hand, if a negative determination is made at step S110 (step S110: No), this routine ends.

Next, details of a decoding process performed by the decoding apparatus 10 will be described using a specific example.

Figures 3, 4:
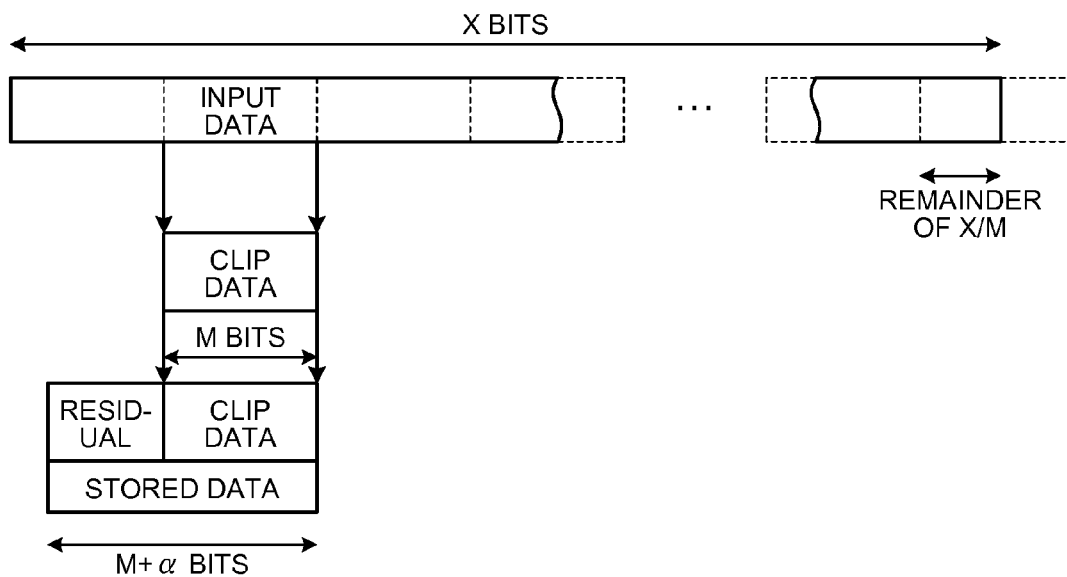
FIG. 3 is a schematic diagram illustrating encoded data.
FIG. 4 is an illustrative diagram of clipping of clip data.

FIG. 3 is a schematic diagram illustrating an example of a plurality of pieces of encoded data contained in input data. Note that FIG. 3 illustrates the case in which the encoded data is encoded data obtained by encoding differences between quantization parameters (see delta_qp in FIG. 3, hereinafter, the differences between quantization parameters may be simply referred to as delta_qp in description). Note also that the encoded data illustrated in FIG. 3 is variable-length encoded data corresponding to the respective differences between quantization parameters. Note also that in FIG. 3 the code length indicates the code length of a corresponding piece of encoded data.

For example, it is assumed that, as illustrated in FIG. 3, the values of delta_qp are −4 to +4 and the pieces of encoded data corresponding to the respective delta_qp have the values illustrated in FIG. 3. In addition, it is assumed that the code lengths of the respective pieces of encoded data have the values illustrated in FIG. 3.

Specifically, the encoded data corresponding to delta_qp "−2" is "0011" in binary and the code length is "4". Note that in the following in the case of binary representation, representation is done adding "b". Specifically, "0011" in binary is represented as "0011b".

The maximum code length of the plurality of pieces of encoded data illustrated in FIG. 3 is "6". Hence, when input data is data containing the plurality of pieces of encoded data illustrated in FIG. 2, the decoding apparatus 10 performs clipping with the maximum code length "6".

FIG. 4 is an illustrative diagram illustrating clipping of clip data by the clipping unit 12. As illustrated in FIG. 4, the clipping unit 12 clips input data containing the plurality of pieces of encoded data illustrated in FIG. 3, every predetermined first code length M which is greater than or equal to the maximum code length of the pieces of encoded data. In the present embodiment, description is made assuming the case in which the first code length M is "6". In addition, description is made assuming the case in which the data length of the input data is X bits (X is an integer greater than M).

Note that in the present embodiment description is made assuming that the first code length M has a fixed value for a single piece of input data. Note that for the first code length M it is preferred that a fixed value be used for a single piece of input data in terms of performing a high-speed decoding process; however, the value of the first code length M for a single piece of input data may be changed according to the arrangement of encoded data contained in the input data. Specifically, when pieces of encoded data are arranged in the order in which their code lengths change regularly, the first code length M may be changed according to the changing rule.

The clipping unit 12 sequentially clips input data every first code length M from the start of the input data. Then, the clipping unit 12 sequentially stores the clipped M-bit clip data in the storage unit 14. When, as illustrated in FIG. 4, there is remaining data (e.g., α bits) in the storage unit 14, the clipping unit 12 joins the clip data to the end of the remaining data. Hence, by clipping (see step S100 in FIG. 2) and storage (see step S102 in FIG. 2) which are performed by the clipping unit 12, for example, stored data with a data length of M+α bits is stored in the storage unit 14.

Note that, though details will be described later, the decoding unit 16 reads encoded data from the stored data and decodes the encoded data. At this time, the decoding unit 16 clips encoded data to be decoded from the stored data stored in the storage unit 14 and decodes the clipped encoded data. Hence, in the storage unit 14 there is stored, as stored data, data having not been decoded yet by the decoding unit 16 that is part of the clip data clipped by the clipping unit 12.

As illustrated in FIG. 4, there may be a case in which the data length X of the input data is not an integral multiple of the first code length M which is a clip unit used by the clipping unit 12. In this case, upon the last clipping for when the clipping unit 12 sequentially clips the input data from the start thereof, the clipping unit 12 clips remaining data with a data length less than the first code length M (the value of the remainder of X/M).

It is preferred that the storage capacity (hereinafter, referred to as the memory size) of the storage unit 14 storing clip data be minimum in terms of apparatus miniaturization, etc. In the present embodiment, it is preferred that the memory size of the storage unit 14 be greater than or equal to a memory size represented by the following Equation (1):

Memory size of the storage unit $14 = M \times 2 - L$      (1).

In Equation (1), M represents the first code length. L represents the minimum code length of pieces of encoded data contained in input data.

When, with no data stored in the storage unit 14, the clipping unit 12 stores clip data in the storage unit 14, the maximum value that can be taken by the data length of the stored data stored in the storage unit 14 is the first code length M. In addition, when the decoding unit 16 clips encoded data to be decoded from the stored data and decodes the encoded data, the data length of stored data in the storage unit 14 has a subtraction value which is obtained by subtracting the data length of the decoded, encoded data from the data length of the stored data which is before the decoding. Hence, the maximum value that can be taken by the data length of the stored data stored in the storage unit 14 which is after the decoding by the decoding unit 16 is a subtraction value (the value of M−L) which is obtained by subtracting the minimum code length L of the pieces of encoded data contained in the input data from the first code length M.

It is assumed that with the stored data with the data length "M−L" stored in the storage unit 14, the next clipping (step S100) and storage (step S102) are further performed by the clipping unit 12. The maximum value that can be taken by the data length of the stored data in this state is "(M−L)+M".

Hence, the storage unit 14 needs to have at least a memory size of "(M−L)+M", i.e., "M×2−L" represented by Equation (1). For this reason, it is preferred that the memory size of the storage unit 14 be greater than or equal to the memory size represented by Equation (1).

Note that in the present embodiment, the case is described in which the memory size of the storage unit 14 is the memory size represented by Equation (1).

Next, decoding of encoded data by the decoding unit 16 will be described. In the present embodiment, the decoding unit 16 reads data from the start of stored data stored in the storage unit 14 to clip and decode encoded data (e.g., N byte).

Hence, when the decoding unit 16 performs decoding with the data length of stored data stored in the storage unit 14 being "M×2−L", the data length of the stored data results in "M×2−L−N".

In the present embodiment, the case in which the decoding unit 16 performs decoding using a lookup table will be described.

Specifically, it is assumed that a plurality of pieces of encoded data contained in input data to be decoded are the encoded data illustrated in FIG. 3. In addition, it is assumed that in the storage unit 14 there is stored, as stored data, the stored data "01011000b" consisting of the remaining data "01b" and the clip data "011000b".

The decoding unit 16 first creates a lookup table for obtaining the data lengths of pieces of encoded data to be decoded.

FIG. 6 is a schematic diagram illustrating an example of a data structure of a lookup table which is created upon decoding by the decoding unit 16 and which is in the process of being created. In FIG. 6, "X" indicates any value (0 or 1). Read data is data to be read by the decoding unit 16 from stored data. The decoding unit 16 expands all combinations of "Xs" illustrated in FIG. 6 and creates a lookup table for obtaining encoded data and the clip length of the encoded data from read data.

FIG. 7 is a schematic diagram illustrating an example of a data structure of a lookup table which is created by the decoding unit 16 upon decoding. As illustrated in FIG. 7, when delta_qp is "0", the value of the first start bit in binary representation is "1". Hence, for "6" which is the value of the first code length M, the remaining 5 bits can be any value. Thus, as illustrated in FIG. 7, when the value of read data read from the stored data is in the range from "32" to "63", the decoding unit 16 analyzes that the value of delta_qp is "0" and the clip length is "1".

FIG. 5 is a schematic diagram illustrating an example of stored data. It is assumed that the decoding unit 16 performs decoding from the stored data illustrated in FIG. 5, based on the lookup table illustrated in FIG. 7. In this case, the first 6-bit (first code length M) data in the stored data is "010110b". Hence, since the stored data corresponds to "010XXX" in the lookup table illustrated in FIG. 6, it can be found that delta_qp is "−1" and the clip length is "3".

Hence, the decoding unit 16 outputs, as decoded data, the difference between quantization parameters (delta_qp)="−1" from the stored data "01011000b", and clips the 3-bit data "010b" used for the decoding from the stored data. FIG. 8 is a schematic diagram illustrating an example of the remaining stored data stored in the storage unit 14. As illustrated in FIG. 8, in this case, the stored data stored in the storage unit 14 after the decoding is the 5-bit data "11000b".

Then, the determining unit 16A of the decoding unit 16 analyzes the stored data remaining in the storage unit 14 to determine whether variable-length decoding can be performed (see steps S106 and S108 in FIG. 2).

Specifically, the determining unit 16A reads and analyzes the stored data stored in the storage unit 14 and thereby determines whether decoding can be performed. For one of the analysis and determination methods, there is a method in which decoding is performed in practice to determine whether encoded data can be obtained.

In this case, when the decoding unit 16 uses the lookup tables in FIGS. 6 and 7 for the stored data stored in the storage unit 14, some devices are required.

The lookup tables illustrated in FIGS. 6 and 7 are, as described above, created based on the maximum code length of pieces of encoded data which are variable-length encoded and which are contained in input data. Hence, in the present embodiment in which the memory size of the storage unit 14 is minimized to the value satisfying Equation (1), the data length of stored data has a value less than the first code length M.

Therefore, in this case, the decoding unit 16 needs to create a lookup table in which lower bits in the lookup tables illustrated in FIGS. 6 and 7 are removed.

Specifically, it is assumed that the storage unit 14 stores therein stored data illustrated in FIG. 8. The data length of the stored data is 5 bits ("11000b"). Hence, the decoding unit 16 removes a "6−5=1" bit from lower bits in the lookup table illustrated in FIG. 7, creating a lookup table illustrated in FIG. 9.

Figures 9, 10:
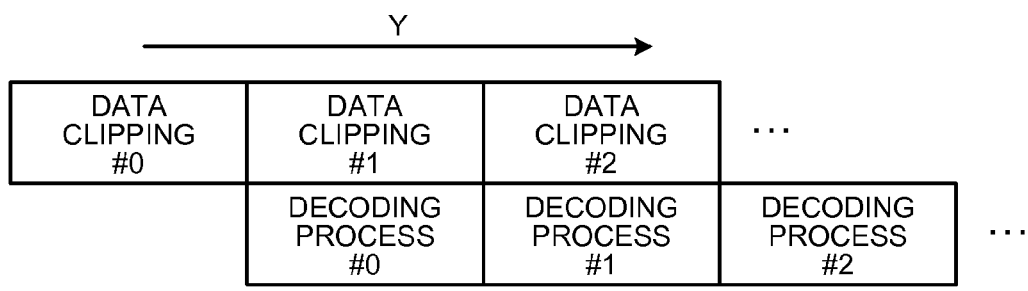
FIG. 9 is a schematic diagram of a data structure of a lookup table.
FIG. 10 is an illustrative diagram of the processing timing of a decoding process.

FIG. 9 is a schematic diagram illustrating an example of a lookup table in which lower bits are removed.

Specifically, when the stored data is "00001b", the clip length is "6". In this case, it is found that the data length of encoded data is short of 1 bit. Hence, in this case, the determining unit 16A determines that variable-length decoding based on the stored data cannot be performed (in FIG. 2, step S108: No).

Note that in the example illustrated in FIG. 8 since the stored data remaining in the storage unit 14 is "1XXXXb", it is found that delta_qp which is decoded data is "0" and the clip length is "1". Hence, in this case, the determining unit 16A determines that variable-length decoding based on the stored data can be performed (in FIG. 2, step S108: Yes).

Note that when a determination as to whether variable-length decoding can be performed at step S108 in FIG. 2 is made by performing decoding, if an affirmative determination is made at step S108 (step S108: Yes), the process at step S104 may be omitted and the process at step S106 may be performed. By this, a further improvement in the efficiency of a decoding process can be achieved.

Note that the above describes the case in which the decoding unit 16 makes a determination at step S108 by decoding stored data. However, by using the following method, the decoding unit 16 may determine whether variable-length decoding based on the stored data can be performed, without performing decoding.

For example, the decoding unit 16 may determine whether variable-length decoding based on the stored data can be performed, by determining whether the logical sum operation result of the upper 4 bits of the stored data stored in the storage unit 14 is "0" or "1".

For example, it is assumed that the stored data stored in the storage unit 14 is the stored data "11000b" illustrated in FIG. 8.

In this case, if the result of the logical sum operation (which may be referred to as OR operation) performed on the upper 4 bits of the stored data is "0", the decoding unit 16 determines that variable-length decoding cannot be performed. This is because the stored data whose logical sum operation result of the upper 4 bits of the stored data is "0" is "0000XXb", i.e., "000010b" or "000011b". Namely, in this case, decoding requires 6 bits, but the data length of the stored data is 5 bits and thus there is a shortage of data.

On the other hand, if the logical sum operation result of the upper 4 bits of the stored data is not "0", i.e., is "1", the decoding unit 16 determines that variable-length decoding can be performed.

As such, the decoding unit 16 may determine whether variable-length decoding can be performed from stored data, by determining whether the logical sum operation result of the upper 4 bits of the stored data is "0". In this case, compared to a method in which whether variable-length decoding can be performed is determined while decoding is performed, a simplification of a process and a reduction of processing time can be achieved.

Next, a determination process in which the decoding unit 16 determines whether input data to be decoded has undecoded data having not been decoded yet (see step S110 in FIG. 2) will be described.

At step S110, the decoding unit 16 reads the data length of undecoded data in input data to be decoded. Note that the input data is remaining data of clip data clipped by the clipping unit 12. Hence, the decoding unit 16 may read the data length of undecoded data by reading the data length of the remaining data of the input data to be decoded.

Then, the decoding unit 16 determines whether the data length of the undecoded data is not "0", and thereby determines whether there is undecoded data. Specifically, when the data length of the undecoded data is "0", the decoding unit 16 makes a negative determination at step S110 (step S110: No). Then, the decoding process ends. On the other hand, when the data length of the undecoded data is not "0", the decoding unit 16 makes an affirmative determination at step S110 (step S110: Yes), and returns to clipping by the clipping unit 12 (step S100).

As described above, in the decoding apparatus 10 of the present embodiment, input data that contains a plurality of pieces of encoded data having been subjected to variable-length encoding is clipped every predetermined first code length M which is greater than or equal to the maximum code length, and variable-length decoding is performed on encoded data contained in the clipped clip data.

Conventionally, input data is read from the start thereof and encoded data located in the start position (the zeroth position) is decoded to analyze an code length (data length) of the encoded data, and variable-length decoding according to the code length is performed on the encoded data. As such, conventionally, a so-called sequential process where input data is sequentially retrieved from the start thereof and processed is performed.

On the other hand, in the decoding apparatus 10 of the present embodiment, as described above, input data that contains a plurality of pieces of encoded data having been subjected to variable-length encoding is clipped every predetermined first code length M which is greater than or equal to the maximum code length, and variable-length decoding is performed on encoded data contained in the clipped clip data.

FIG. 10 is an illustrative diagram of the processing timing of a decoding process performed on input data to be decoded, by the decoding apparatus 10 of the present embodiment.

As illustrated in FIG. 10, in the decoding apparatus 10 of the present embodiment, the clipping unit 12 sequentially reads input data to be decoded from the start thereof (see a direction of arrow Y in FIG. 10), and performs data clipping every predetermined first code length M (see data clipping #0, data clipping #1, and data clipping #2 in FIG. 10). Hence, the decoding unit 16 starts decoding of clip data that is clipped by performing the zeroth (see #0 in FIG. 10) data clipping by the clipping unit 12, without waiting for the clipping unit 12 to clip all data. Namely, the decoding unit 16 decodes already clipped clip data while the clipping unit 12 is performing clipping. Hence, in the decoding apparatus 10 of the present embodiment, at least a part of each of data clipping by the clipping unit 12 and decoding by the decoding unit 16 can be performed in parallel.

As such, the decoding apparatus 10 of the present embodiment can clip data at high speed from input data to be decoded and perform a decoding process.

Therefore, the decoding apparatus 10 of the present embodiment can perform high-speed decoding of encoded data having been subjected to variable-length encoding.

In addition, as described above, in the decoding apparatus 10 of the present embodiment, the value of the first code length M which is a unit of clipping clip data from input data by the clipping unit 12 is set to a value greater than or equal to the maximum code length of a plurality of pieces of encoded data contained in the input data. Hence, in the decoding apparatus 10 of the present embodiment, since data with a length greater than or equal to the data length required for decoding by the decoding unit 16 can be stored in the storage unit 14, a reduction in decoding process can be achieved.

In addition, in the decoding apparatus 10 of the present embodiment, after the clipping unit 12 stores clipped clip data in the storage unit 14, the decoding unit 16 sequentially reads and decodes the clip data. Hence, before the code length of encoded data is determined by decoding, clip data can be clipped from input data. Thus, parallel decoding or high-speed decoding by pipeline processing can be performed on a plurality of pieces of encoded data contained in pieces of clip data clipped at different timings.

In addition, in the present embodiment, the decoding unit 16 (determining unit 16A) determines whether variable-length decoding can be performed, based on stored data stored in the storage unit 14. Then, when it is determined that decoding using the stored data cannot be performed, the clipping unit 12 clips clip data with the first code length from input data and stores the clip data in the storage unit 14. Hence, the storage unit 14 can store only data with a minimum necessary data length which is used for decoding by the decoding unit 16. As such, in the present embodiment, only when there is a shortage of data used for decoding, clip data with the first code length is clipped from input data. Hence, minimization of the memory size of the storage unit 14 can be achieved.

Note that in the present embodiment, the case is described in which encoded data contained in input data is encoded data of delta_qp (differences between quantization parameters). However, the encoded data contained in the input data is not limited to encoded data of differences between quantization parameters. For example, the input data may contain a plurality of types of encoded parameters with different maximum code lengths, such as differences between quantization parameters (delta_qp) and motion vectors (mv_x, mv_y). When the input data contains a plurality of types of encoded data, the decoding apparatus 10 performs such a number of decoding processes that is according to the type of encoded data.

In addition, in the decoding apparatus 10 of the present embodiment, the case of performing analysis of stored data and a determination as to whether variable-length decoding can be performed on the stored data is described. However, in the decoding apparatus 10, analysis of stored data and a determination as to whether variable-length decoding can be performed (see steps S106 and S108 in FIG. 2) in a decoding process illustrated in FIG. 2 may be omitted.

Figure 11:
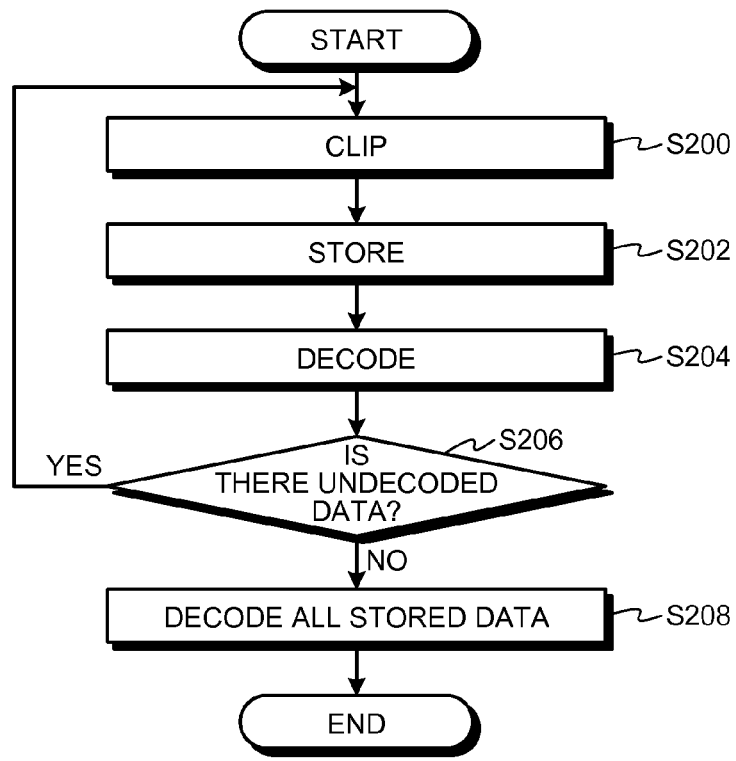
FIG. 11 is a flowchart illustrating another procedure of a decoding process.

In this case, the decoding apparatus 10 may perform a decoding process illustrated in FIG. 11. FIG. 11 is a flowchart illustrating another procedure of a decoding process.

First, the clipping unit 12 clips input data every first code length M (step S200) and stores the clipped data in the storage unit 14 (step S202). Then, the decoding unit 16 decodes the stored data stored in the storage unit 14 (step S204). Then, the decoding unit 16 determines whether there is undecoded data (step S206). Then, if an affirmation determination is made at step S206 (step S206: Yes), processing returns to the above-described step S200. On the other hand, if a negative determination is made at step S206 (step S206: No), processing proceeds to step S208. At step S208, the decoding unit 16 decodes all stored data stored in the storage unit 14 (step S208). Then, this routine ends.

Note that the processes at steps S200, S202, S204, and S206 are the same as those at steps S100, S102, S104, and S110 in FIG. 2, respectively.

As such, by the decoding apparatus 10 performing a decoding process illustrated in FIG. 11 instead of a decoding process illustrated in FIG. 2, it becomes unnecessary to analyze stored data, enabling to achieve a further simplification of the decoding process. Note, however, that when the decoding process illustrated in FIG. 11 is performed, stored data remaining in the storage unit 14 may become larger than that for when the decoding process illustrated in FIG. 2 is performed.

Specifically, when the decoding process illustrated in FIG. 11 is performed, the data amount of stored data to be stored in the storage unit 14 is much larger than the aforementioned "M×2−L". Hence, when the decoding process illustrated in FIG. 11 is performed, there is a need to prepare a storage unit 14 with a larger memory size for a larger data size of input data.

Hence, when the decoding apparatus 10 performs the decoding process illustrated in FIG. 11, it is preferred that the decoding apparatus 10 be applied to an apparatus that can mount, as the storage unit 14, a memory with a larger memory size compared to that for when the decoding process illustrated in FIG. 2 is performed.

Note that when the decoding process illustrated in FIG. 11 is performed instead of the decoding process illustrated in FIG. 2, the processes at steps S200 to S206 are performed, and if a negative determination is made at step S206 (step S206: No), at step S208 all stored data stored in the storage unit 14 needs to be decoded. Since the decoding at step S208 is the same process as the decoding process at step S204, the overall processing amount of the decoding process does not increase compared to the decoding process illustrated in FIG. 2.

Second Embodiment

In the present embodiment, in addition to a decoding process based on stored data which is stored clip data clipped from input data in the first embodiment, a mode in which a decoding process is performed on encoded data contained in input data will be described.

Figure 12:
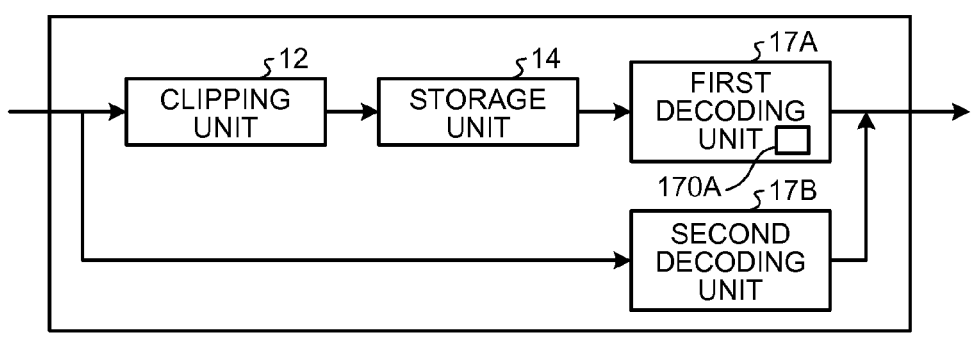
FIG. 12 is a block diagram of a decoding apparatus.

FIG. 12 is a block diagram illustrating a decoding apparatus 10A of the present embodiment. The decoding apparatus 10A accepts input data containing a plurality of pieces of encoded data having been subjected to variable-length encoding.

In the decoding apparatus 10A of the present embodiment, the case will be described in which input data contains a plurality of types of encoded data with different maximum code lengths.

The decoding apparatus 10A includes a clipping unit 12, a storage unit 14, a first decoding unit 17A, and a second decoding unit 17B. The first decoding unit 17A includes a determining unit 170A. The clipping unit 12 and the storage unit 14 are the same as those in the first embodiment. In addition, the first decoding unit 17A and the determining unit 170A are the same as a decoding unit 16 and a determining unit 16A in the first embodiment, respectively.

The second decoding unit 17B sequentially clips and decodes encoded data of a type whose maximum code length is greater than or equal to a predetermined value in a plurality of types of encoded data contained in input data (which may be hereinafter referred to as second decoding). On the other hand, the first decoding unit 17A sequentially clips and decodes encoded data of a type other than the type clipped by the second decoding unit 17B in the plurality of types of encoded data contained in the input data (which may be hereinafter referred to as first decoding).

The predetermined value is preset according to an encoding method for encoded data contained in input data which is handled by the decoding apparatus 10A.

Note that in the decoding apparatus 10A of the present embodiment, the case will be described in which input data contains two types of encoded data with different maximum code lengths. Hence, the first decoding unit 17A clips and decodes encoded data of a type with a small maximum code length (which may be hereinafter referred to as the first type) in the two types of encoded data. On the other hand, the second decoding unit 17B clips and decodes encoded data of a type with a large maximum code length (which may be hereinafter referred to as the second type) in the two types of encoded data.

The encoded data of the first type with a small maximum code length is, for example, encoded data of differences between quantization parameters. The encoded data of the second type with a large maximum code length is, for example, encoded data of orthogonal transform coefficients used in MPEG.

In addition, description is made assuming the case in which in input data used in the present embodiment, a plurality of pieces of encoded data of the first type with a small maximum code length and encoded data of the second type with a large maximum code length are arranged in this order from the start of the input data.

Figure 13:
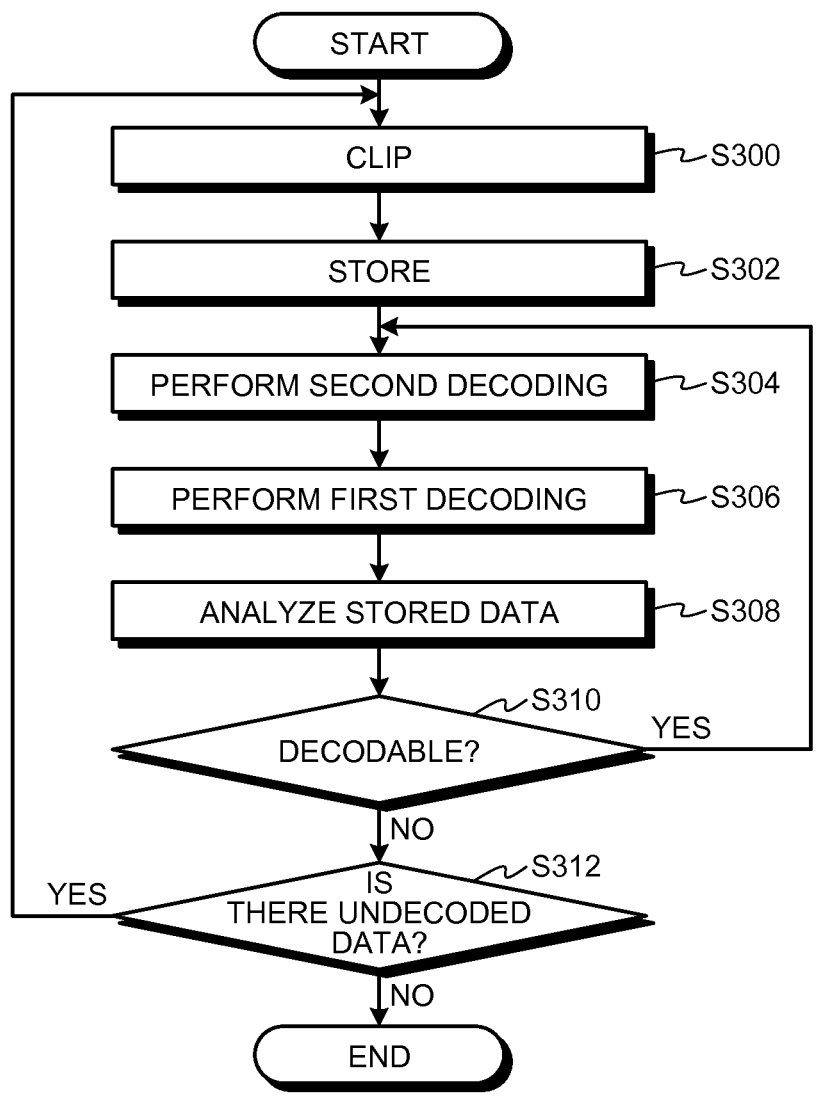
FIG. 13 is a flowchart illustrating a procedure of a decoding process.

FIG. 13 is a flowchart illustrating a procedure of a decoding process performed by the decoding apparatus 10A.

First, the clipping unit 12 clips a group of pieces of encoded data of the first type with a small maximum code length in accepted input data, every first code length (step S300). Then, the clipping unit 12 stores the clipped clip data in the storage unit 14 (step S302). The processes at steps S300 and S302 are the same as the processes at steps S100 and S102 in the first embodiment. In addition, the definition of the first code length is the same as that of the first code length (first code length M) in the first embodiment.

Then, the second decoding unit 17B directly reads encoded data of the second type with a large maximum code length from the input data, and performs second decoding where the encoded data is decoded (step S304).

Then, as in steps S104 to S110 performed by the decoding unit 16 in the first embodiment, the first decoding unit 17A performs processes at steps S306 to S312 on encoded data of the first type in the stored data stored in the storage unit 14.

Note that in the present embodiment, if an affirmative determination is made at step S310 corresponding to a determination at step S108 in the first embodiment (step S310: Yes), processing returns to step S304. On the other hand, if a negative determination is made at step S310 (step S310: No), processing proceeds to step S312. Then, if an affirmative determination is made at step S312 (step S312: Yes), processing returns to the above-described step S300. On the other hand, if a negative determination is made at step S312 (step S312: No), this routine ends.

As described above, in the present embodiment, for encoded data of the first type with a small maximum code length, the clipping unit 12 clips the data every first code length M and stores the clipped data in the storage unit 14, and then, the first decoding unit 17A sequentially decodes (first decoding) the data. On the other hand, for encoded data of the second type with a large maximum code length, without storing the data in the storage unit 14, the second decoding unit 17B directly clips the data from input data and decodes (second decoding) the data.

Therefore, in the decoding apparatus 10A of the present embodiment, in addition to the effects obtained in the first embodiment, an improvement in the speed of a decoding process can be further achieved.

In addition, for example, when encoded data contained in input data to be decoded is encoded data of the second type with a large maximum code length, such as encoded data of orthogonal transform coefficients used in MPEG, for the storage unit 14, a storage unit 14 with a larger memory size than that in the first embodiment needs to be prepared.

On the other hand, in the decoding apparatus 10A of the present embodiment, for encoded data of the second type with a large maximum code length, without storing the data in the storage unit 14, the second decoding unit 17B directly clips the data from input data and decodes (second decoding) the data. Hence, in addition to the effects obtained in the first embodiment, a reduction in the memory size of the storage unit 14 can be further achieved.

Note that in FIG. 13 the case is described in which in the decoding apparatus 10A after second decoding by the second decoding unit 17B is performed, first decoding by the first decoding unit 17A is performed. However, after first decoding by the first decoding unit 17A is performed, second decoding by the second decoding unit 17B may be performed.

Figure 14:
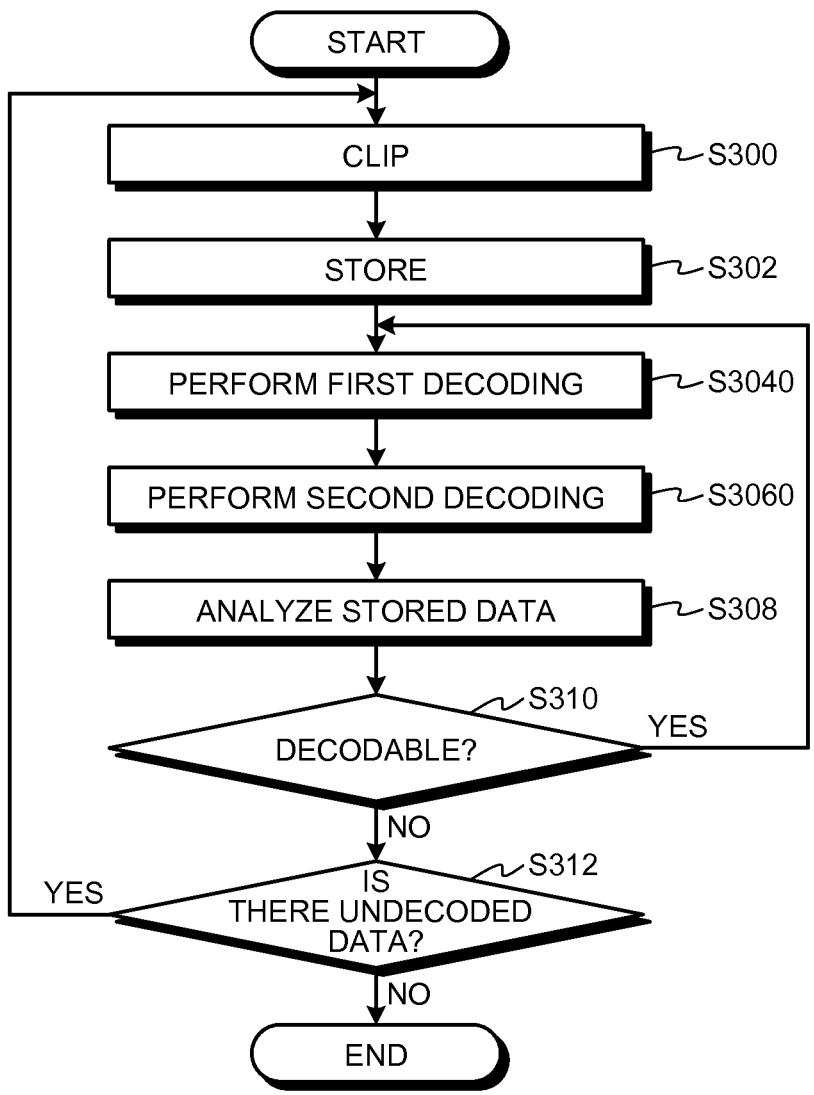
FIG. 14 is a flowchart illustrating another procedure of a decoding process.

In this case, the decoding apparatus 10A performs a decoding process illustrated in FIG. 14.

FIG. 14 is a flowchart illustrating another procedure of a decoding process performed by the decoding apparatus 10A.

First, as in FIG. 13, the clipping unit 12 clips a group of pieces of encoded data of the first type with a small maximum code length in accepted input data, every first code length (step S300). Then, the clipping unit 12 stores the clipped clip data in the storage unit 14 (step S302).

Then, as in the above-described step S306, the first decoding unit 17A performs first decoding (step S3040). Then, as in the above-described step S304, the second decoding unit 17B directly reads encoded data of the second type with a large maximum code length from the input data, and performs second decoding where the encoded data is decoded (step S3060).

Then, the same processes as those at the above-described steps S308 to S312 are performed, and this routine ends.

As such, the order of first decoding by the first decoding unit 17A and second decoding by the second decoding unit 17B may be reversed.

Note that in the present embodiment a mode is described in which after decoding by either one of the first decoding unit 17A and the second decoding unit 17B is performed, decoding by the other one is performed. However, first decoding by the first decoding unit 17A and second decoding by the second decoding unit 17B may be performed in parallel.

Figure 15:
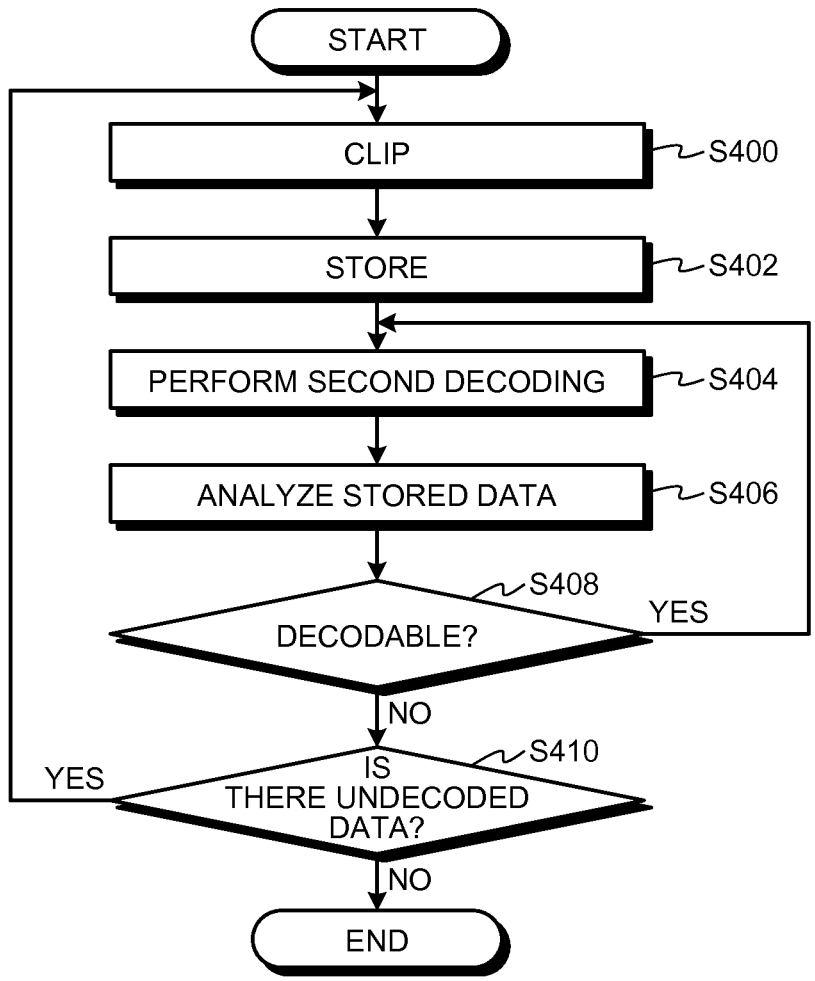
FIG. 15 is a flowchart illustrating another procedure of a decoding process.
Figure 16:
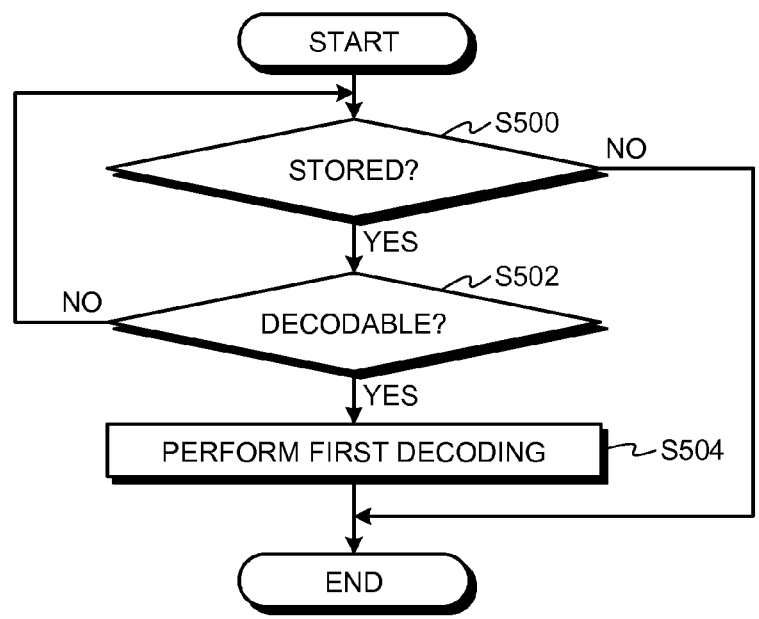
FIG. 16 is a flowchart illustrating another procedure of a decoding process.

In this case, the decoding apparatus 10A performs processes illustrated in FIGS. 15 and 16.

FIGS. 15 and 16 are flowcharts illustrating another procedure of a decoding process performed by the decoding apparatus 10A of the present embodiment.

First, the clipping unit 12 clips a group of pieces of encoded data of the first type with a small maximum code length in accepted input data, every first code length (step S400). Then, the clipping unit 12 stores the clipped clip data in the storage unit 14 (step S402). Then, the second decoding unit 17B directly reads encoded data of the second type with a large maximum code length from the input data, and performs second decoding where the encoded data is decoded (step S404).

The processes at steps S400 to S404 are the same as those at the above-described steps S300 to S304.

Then, as in steps S106 to S110 performed by the decoding unit 16 in the first embodiment, the first decoding unit 17A performs analysis of the stored data, a determination as to whether variable-length decoding can be performed, and a determination as to whether there is undecoded data (steps S406 to S410). Then, if an affirmative determination is made at step S410 (step S410: Yes), processing returns to the above-described step S400. On the other hand, if a negative determination is made at step S410 (step S410: No), this routine ends.

Then, in the decoding apparatus 10A, while the decoding process in FIG. 15 is performed, the first decoding unit 17A performs a parallel process illustrated in FIG. 16 in parallel.

FIG. 16 is a flowchart illustrating a procedure of a parallel process performed by the first decoding unit 17A.

First, the first decoding unit 17A determines whether stored data has been stored in the storage unit 14 (step S500). If a negative determination is made at step S500 (step S500: No), this routine ends. On the other hand, if an affirmative determination is made at step S500 (step S500: Yes), processing proceeds to step S502. At step S502, as in step S408, the first decoding unit 17A determines whether variable-length decoding can be performed (step S502).

If a negative determination is made at step S502 (step S502: No), processing returns to the above-described step S500. On the other hand, if an affirmative determination is made at step S502 (step S502: Yes), processing proceeds to step S504.

At step S504, as in step S306, the first decoding unit 17A performs first decoding (step S504). Then, this routine ends.

By the decoding apparatus 10A performing a parallel process illustrated in FIG. 16 while performing a decoding process illustrated in FIG. 15, the decoding apparatus 10A can perform first decoding by the first decoding unit 17A and second decoding by the second decoding unit 17B in parallel.

Hence, in addition to the effects obtained in the first embodiment, a reduction in processing time can be further achieved.

As described above, according to the decoding apparatus 10A of the present embodiment, even when input data contains a plurality of types of encoded data with different maximum code lengths, a high-speed decoding process can be performed on the input data.

Here, a mode is assumed in which input data contains a plurality of types of encoded data whose maximum code lengths differ greatly, and particularly, there are both encoded data of a first type whose maximum code length of the encoded data is small (e.g., #a) and encoded data of a second type whose maximum code length of the encoded data is large (e.g., #b). In such a case, the decoding processing time may increase.

On the other hand, in the present embodiment, even when there are a plurality of types of encoded data with different maximum code lengths, the occurrence of waiting time for a decoding process can be suppressed.

Figure 17:
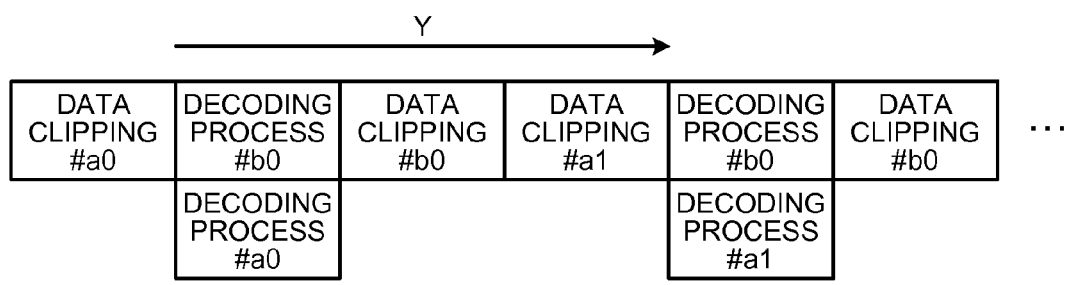
FIG. 17 is an illustrative diagram of the processing timing of a decoding process.

FIG. 17 is an illustrative diagram of the processing timing of a decoding process performed on input data to be decoded, by the decoding apparatus 10A of the present embodiment.

As illustrated in FIG. 17, in the decoding apparatus 10A of the present embodiment, the clipping unit 12 sequentially reads accepted input data from the start thereof (see a direction of arrow Y in FIG. 17), and clips a group of pieces of encoded data of the first type with a small maximum code length every first code length M (data clipping #a0 in FIG. 17). The clipped clip data is stored in the storage unit 14.

Then, when the first decoding unit 17A is performing first decoding on the clipped clip data (see decoding process #a0), the second decoding unit 17B performs, in parallel, second decoding on encoded data of the second type with a large maximum code length which is directly read from the input data (see decoding process #b0).

Hence, according to the decoding apparatus 10A of the present embodiment, a plurality of decoding processes can be performed in parallel on the same input data.

Accordingly, in addition to the effects obtained in the first embodiment, a high-speed decoding process can be further performed.

Third Embodiment

In the present embodiment, an encoding apparatus that generates input data to be decoded in the first embodiment and the second embodiment will be described.

Figure 18:
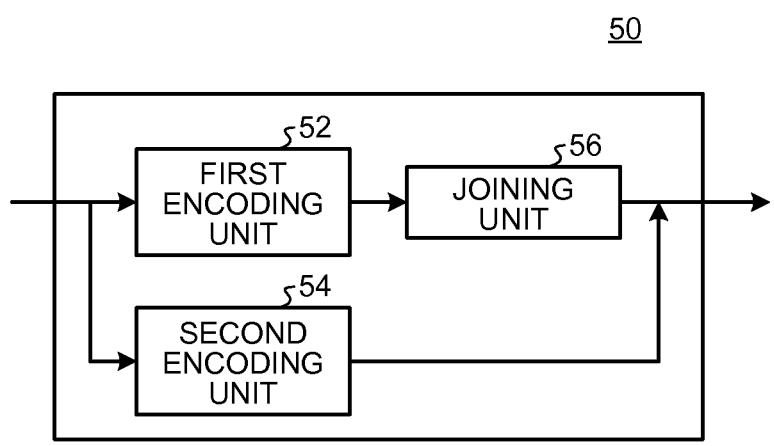
FIG. 18 is a block diagram of an encoding apparatus.

FIG. 18 is a block diagram illustrating an encoding apparatus 50 of the present embodiment.

The encoding apparatus 50 of the present embodiment encodes information to be decoded, using a variable-length encoding scheme and thereby generates encoded data. The encoding apparatus 50 outputs output data containing the generated encoded data. The aforementioned decoding apparatus 10 and decoding apparatus 10A accept the output data containing the encoded data which is generated by the encoding apparatus 50, as input data to be decoded.

The encoding apparatus 50 is incorporated in an apparatus that is implemented by hardware such as an image encoding LSI (Large Scale Integration). By using encoded data obtained by encoding performed by the encoding apparatus 50, for example, the display responsiveness of a display can be enhanced.

The encoding apparatus 50 includes a first encoding unit 52, a second encoding unit 54, and a joining unit 56. The first encoding unit 52 and the second encoding unit 54 encode encoding target information by different variable-length encoding schemes (details will be described later). The joining unit 56 joins together encoded data generated by the first encoding unit 52, packetizes the data at a predetermined data length, and sequentially outputs the packets (details will be described later).

Figure 19:
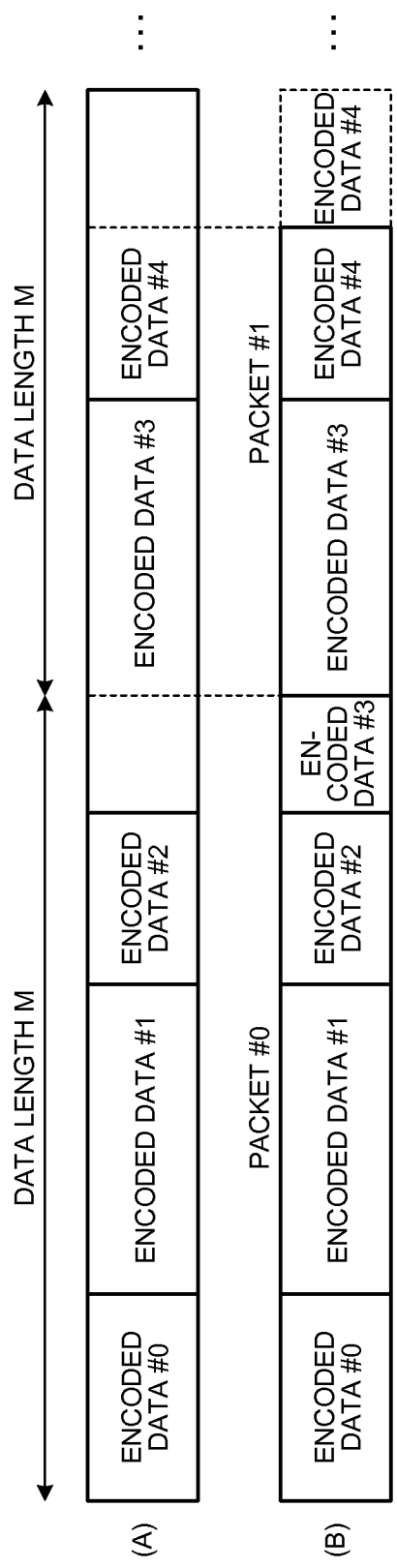
FIG. 19 is a schematic diagram of a data structure of output data.

FIG. 19 is a schematic diagram illustrating an example of a data structure of output data to be output from the encoding apparatus 50.

As illustrated in FIG. 19(A), output data contains pieces of encoded data encoded by the first encoding unit 52 and the second encoding unit 54. The encoding apparatus 50 packetizes the pieces of encoded data at a predetermined data length (details will be described later, for example, every M bytes) (see FIG. 19(B)) and sequentially outputs the packets (see packets #0 to #1, etc., in FIG. 19). Note that a packet corresponds to joined data.

Figure 20:
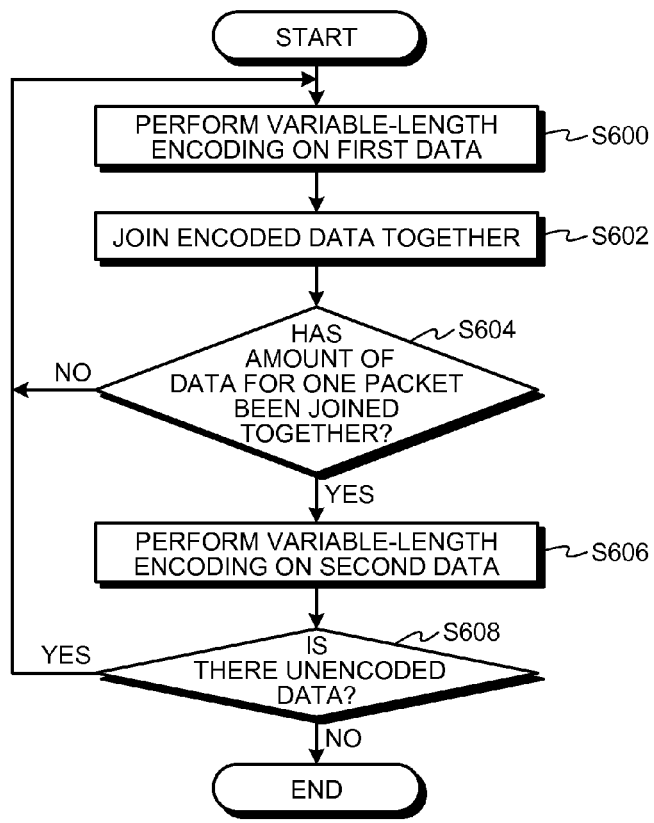
FIG. 20 is a flowchart illustrating a procedure of an encoding process.

FIG. 20 is a flowchart illustrating a procedure of an encoding process performed by the encoding apparatus 50.

Note that it is assumed that encoding target data to be encoded by the encoding apparatus 50 contains a plurality of types of encoding target information whose maximum code lengths obtained by encoding are different. Note that in the present embodiment description is made assuming the case in which two types of encoding target information are contained. Note also that in the present embodiment the two types of encoding target information are referred to as first data and second data in description.

The first data is data whose maximum code length obtained when variable-length encoding is performed is relatively small. The first data is, for example, differences between quantization parameters (delta_qp) in MPEG. As such, the first data is data whose dynamic range of values is relatively small (e.g., −51 to +51 in H.264).

The second data is data whose maximum code length obtained when variable-length encoding is performed is relatively large. The second data has a characteristic that the range of values that can be taken by the second data is wide, or the second data contains a plurality of pieces of information. The second data is, for example, orthogonal transform coefficients in MPEG. As such, the second data is data whose dynamic range of values is relatively large (e.g., −32768 to 32767 in H.264). In the case of performing an encoding process on a 16×16-pixel block basis when the second data is encoded, 256 orthogonal transform coefficients are encoded.

Note that encoded data obtained by encoding the first data corresponds to the above-described encoded data of the first type with a small maximum code length. Note also that encoded data obtained by encoding the second data corresponds to the above-described encoded data of the second type with a large maximum code length.

First, the first encoding unit 52 variable-length encodes first data contained in encoding target data (step S600). The first encoding unit 52 outputs the encoded data to the joining unit 56.

The joining unit 56 joins together the encoded data encoded by the first encoding unit 52 (step S602).

Then, the joining unit 56 determines whether an amount of encoded data for one packet has been joined together (step S604). The joining unit 56 makes a determination at step S604 by determining whether encoded data with a predetermined data length (details will be described later) has been joined together.

If a negative determination is made at step S604 (step S604: No), processing returns to the above-described step S600. On the other hand, if an affirmative determination is made at step S604 (step S604: Yes), processing proceeds to step S606.

At step S606, the second encoding unit 54 variable-length encodes second data (step S606).

Then, the first encoding unit 52 determines whether unencoded data having not been encoded yet remains in the encoding target data (step S608). If an affirmative determination is made at step S608 (step S608: Yes), processing returns to the above-described step S600. On the other hand, if a negative determination is made at step S608 (step S608: No), this routine ends.

Next, an encoding process performed by the encoding apparatus 50 will be described in detail.

First, the process of variable-length encoding first data contained in encoding target data by the first encoding unit 52 will be described. Note that this process corresponds to the above-described step S600.

The first encoding unit 52 performs an encoding process using a variable-length encoding scheme. The variable-length encoding scheme may be any scheme. For example, when first data is differences between quantization parameters (delta_qp), an encoding scheme using a Golomb code illustrated in FIG. 3 may be used.

Figure 21:
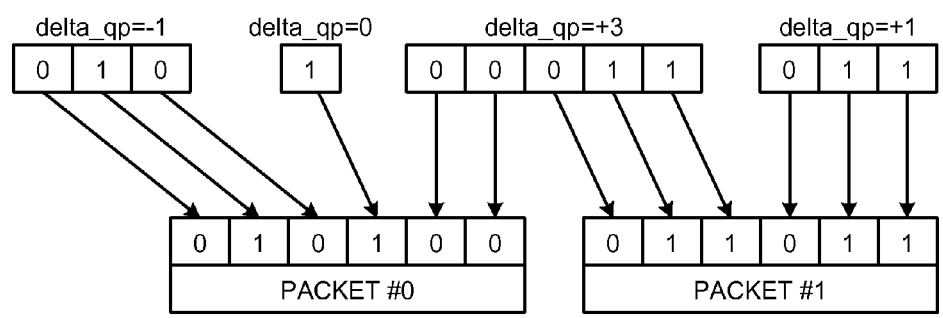
FIG. 21 is an illustrative diagram of variable-length encoding and packetization.

FIG. 21 is an illustrative diagram of variable-length encoding by the first encoding unit 52 and joining by the joining unit 56 (packetization).

Specifically, it is assumed that the first encoding unit 52 has variable-length encoded differences between quantization parameters (delta_qp) illustrated in FIG. 3 in the order of "−1", "0", "+3", and "+1". As a result, the pieces of encoded data corresponding to the differences between quantization parameters are, as illustrated in FIG. 21, "010b", "1b", "00011b", and "011b", respectively.

The first encoding unit 52 sequentially outputs the pieces of encoded data obtained by the encoding to the joining unit 56. The joining unit 56 joins together the pieces of encoded data accepted from the first encoding unit 52, to create a packet with a predetermined data length (corresponding to the processes at steps S602 to S604 in FIG. 20).

The predetermined data length used upon the packet creation is set to a value greater than or equal to the maximum code length obtained when first data and second data are variable-length encoded. This is to enable to obtain at least one piece of first data when one packet is decoded. Namely, the data length is set to the same value as the first code length M which is used in the first embodiment and the second embodiment.

As illustrated in FIG. 3, in the present embodiment, the maximum code length of delta_qp which are differences between quantization parameters serving as first data is 6. Hence, in the present embodiment, the joining unit 56 creates a packet with a data length of 6 bits.

If the joining unit 56 makes an affirmative determination at the above-described step S604 which is the step of determining whether an amount of encoded data for one packet has been joined together (step S604: Yes), the joining unit 56 outputs the joined packet (joined data).

On the other hand, when the joining unit 56 has not joined together an amount of encoded data for one packet, the joining unit 56 makes a negative determination at step S604 (step S604: No) and processing returns to the above-described step S600.

For example, at the stage where the first encoding unit 52 has encoded the difference between quantization parameters "delta_qp"="−1" among a plurality of pieces of first data contained in encoded data to be encoded, the data amount of joined data is 3 bits. Hence, in this case, a negative determination is made at step S604. Then, when 1-bit encoded data is generated by encoding the difference between quantization parameters "delta_qp"="0" by the first encoding unit 52, the joined data results in 4 bits. Even at this stage, the data amount is less than 6 bits and thus a negative determination is made at step S604.

Then, when 5-bit encoded data is generated by encoding the difference between quantization parameters "delta_qp"="+3" by the first encoding unit 52, the joined data results in 9 bits. At this stage, the joining unit 56 makes an affirmative determination in the determination at step S604 (step S604: Yes).

FIG. 22 is a schematic diagram illustrating an example of output data to be output from the encoding apparatus 50.

By an amount of encoded data for one packet (6 bits in the present embodiment) output from the joining unit 56, an amount of encoded data for one packet is output in which the first packet (see packet #0 in FIG. 22) includes encoded data of the difference between quantization parameters "delta_qp"="−1" (encoded data A #0 in FIG. 22), encoded data of the difference between quantization parameters "delta_qp"="0" (encoded data A #1 in FIG. 22), and a part of encoded data of the difference between quantization parameters "delta_qp"="+3" (see encoded data A #2a in FIG. 22).

Thereafter, the joining unit 56 sequentially creates and outputs a packet (see packet #1 in FIG. 22).

Referring back to FIG. 20, next, the second encoding unit 54 variable-length encodes second data (see step S606 in FIG. 20).

The second encoding unit 54 variable-length encodes second data using a variable-length encoding scheme. The scheme for variable-length encoding by the first encoding unit 52 may be any scheme.

For example, it is assumed that the second data is orthogonal transform coefficients. In this case, the second encoding unit 54 performs, for example, variable-length encoding using a Huffman code which is used in MPEG-2.

The second encoding unit 54 outputs a packet of the encoded data (joined data) which is obtained by variable-length encoding the second data. The encoding apparatus 50 alternately outputs encoded data in packet units which is output from the first encoding unit 52 and encoded data which is output from the second encoding unit 54. Hence, the output data output from the encoding apparatus 50 has a data structure illustrated in FIG. 22.

Specifically, as illustrated in FIG. 22, the output data to be output from the encoding apparatus 50 has a structure in which a packet of pieces of encoded data obtained by variable-length encoding first data and encoded data obtained by variable-length encoding second data are arranged alternately.

Referring back to FIG. 20, if an affirmative determination is made in the process at step S608 in FIG. 20 (step S608: Yes), processing returns to the above-described step S600. On the other hand, if a negative determination is made at step S608 (step S608: No), this routine ends.

As described above, for first data whose maximum code length obtained upon variable-length encoding is small, the encoding apparatus 50 of the present embodiment packetizes encoded data having been subjected to variable-length encoding, every fixed length.

Therefore, the encoding apparatus 50 of the present embodiment can generate output data on which a decoding process can be performed by clipping encoded data at high speed upon the decoding process.

Note that in the present embodiment, as described above, for first data whose maximum code length obtained upon variable-length encoding is small, packetization is performed where an amount of data corresponding to the data length M is encoded. Hence, before encoding second data whose maximum code length obtained upon variable-length encoding is large, encoding of first data is repeatedly performed.

Hence, when the numbers of pieces of first data and pieces of second data contained in encoding target data to be encoded by the encoding apparatus 50 are the same, encoding of the first data may be completed first and the second data may remain unencoded. Therefore, it is preferred that when an encoding process for first data has been completed in an encoding process illustrated in FIG. 20, the encoding process for first data (i.e., the processes at steps S600 to S604 by the first encoding unit 52 and the joining unit 56) be omitted.

In addition, in the determination as to whether there is unencoded data at step S608, a determination as to whether each of first data and second data remains in unencoded data may be further made. Then, when it is determined that both first data and second data remain in the unencoded data, processing proceeds to the process at step S606 performed by the second encoding unit 54. Note that when only first data remains in the unencoded data, processing returns to step S600.

In addition, the timing at which the second encoding unit 54 outputs encoded data obtained by variable-length encoding second data may be performed for an amount corresponding to encoded data obtained by variable-length encoding first data.

FIG. 23 is a schematic diagram illustrating another example of output data to be output from the encoding apparatus 50.

Specifically, the first packet (packet #0 in FIG. 23) includes the zeroth encoded data of first data (encoded data A #0 in FIG. 23) and the first encoded data of the first data (encoded data A #1 in FIG. 23). Hence, the second encoding unit 54 performs encoding of second data up to the first encoded data of the second data.

On the decoding apparatus (10, 10A) side that accepts, as input data, output data having the data structure illustrated in FIG. 22 and decodes the data, upon decoding the first encoded data of first data (encoded data A #1 in FIG. 22) and the first encoded data of second data (encoded data B #1 in FIG. 22), for the first data there is a need to hold data up to the third data. Due to this, a storage unit 14 with a larger memory size needs to be prepared.

On the other hand, when output data has the data structure illustrated in FIG. 23, on the decoding apparatus (10, 10A) side that accepts, as input data, the output data and decodes the data, upon the decoding, for first data there only needs to hold data up to the middle of the second data (see encoded data A #2a in FIG. 23). Hence, compared to the case in which output data has the data structure illustrated in FIG. 22, by allowing output data to have the data structure illustrated in FIG. 23, the memory size of a memory (storage unit 14) on the decoding apparatus (10, 10A) side can be suppressed.

Note that programs for performing decoding processes and an encoding process which are performed by the decoding apparatus 10, the decoding apparatus 10A, and the encoding apparatus 50 in the above-described embodiments are provided such that the programs are preinstalled in a ROM, etc.

The programs for performing decoding processes and an encoding process which are performed by the decoding apparatus 10, the decoding apparatus 10A, and the encoding apparatus 50 in the above-described embodiments may be configured to be provided such that the programs are recorded in installable format or executable format files in a computer-readable recording medium such as a CD-ROM, a flexible disk (FD), a CD-R, or a DVD (Digital Versatile Disk).

Furthermore, the programs for performing decoding processes and an encoding process which are performed by the decoding apparatus 10, the decoding apparatus 10A, and the encoding apparatus 50 in the above-described embodiments may be configured to be provided such that the programs are stored on a computer connected to a network such as the Internet, and are downloaded via the network. In addition, the programs for performing decoding processes and an encoding process which are performed by the decoding apparatus 10, the decoding apparatus 10A, and the encoding apparatus 50 in the above-described embodiments may be configured to be provided or distributed via a network such as the Internet.

The programs for performing decoding processes and an encoding process which are performed by the decoding apparatus 10, the decoding apparatus 10A, and the encoding apparatus 50 in the above-described embodiments have a module configuration including the aforementioned units. For the actual hardware, a CPU (processor) reads and executes a program from the ROM, by which each unit is loaded onto a main memory and created on the main memory. Note that the units included in the decoding apparatus 10, the decoding apparatus 10A, and the encoding apparatus 50 in the above-described embodiments may be configured by hardware such as circuits.

Fourth Embodiment

Figure 24:
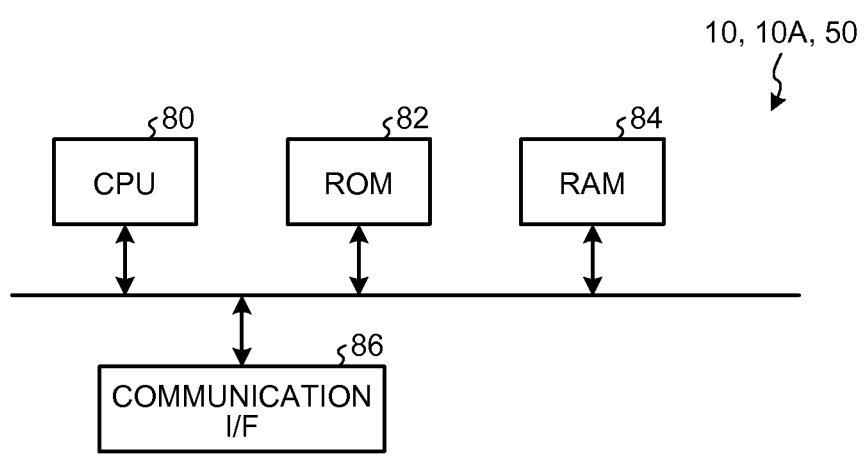
FIG. 24 is a block diagram illustrating a hardware configuration of the encoding apparatus and the decoding apparatus according to the embodiments.

Given below is the explanation about a hardware configuration of the decoding apparatus 10, the decoding apparatus 10A, and the encoding apparatus 50. FIG. 24 is a block diagram illustrating a hardware configuration of the decoding apparatus 10, the decoding apparatus 10A, and the encoding apparatus 50.

Each of the decoding apparatus 10, the decoding apparatus 10A, and the encoding apparatus 50 according to the embodiments has the hardware configuration of a commonly-used computer in which a communication interface (I/F) 86, a central processing unit (CPU) 80, a read only memory (ROM) 82, and a random access memory (RAM) 84 are connected to each other by a bus.

The CPU 80 is a processor that controls the overall operations performed in the decoding apparatus 10, the decoding apparatus 10A, and the encoding apparatus 50. The RAM 84 is used to store the data required for various operations performed by the corresponding CPU 80. The ROM 82 is used to store computer programs used in implementing various operations performed by the corresponding CPU 80. The communication I/F 86 is an interface that establishes connection with an external device via a communication line, and sends data to and receives data from that external device.

Meanwhile, a computer program executed in the decoding apparatus 10, and the decoding apparatus 10A for performing the decoding operation as well as a computer program executed in the encoding apparatus 50 for performing the encoding operation is stored in advance in the ROM 82.

Alternatively, the computer program executed in the decoding apparatus 10, and the decoding apparatus 10A for performing the decoding operation as well as a computer program executed in the encoding apparatus 50 for performing the encoding operation may be recorded in the form of an installable file or an executable file in a computer-readable storage medium such as a compact disk read only memory (CD-ROM), a flexible disk (FD), a compact disk readable (CD-R), or a digital versatile disk (DVD); and can be provided as a computer program product.

Still alternatively, the computer program executed in the decoding apparatus 10, and the decoding apparatus 10A for performing the decoding operation as well as a computer program executed in the encoding apparatus 50 for performing the encoding operation may be saved as a downloadable file on a computer connected to the Internet or can be made available for distribution through a network such as the Internet.

Meanwhile, the computer program executed in the decoding apparatus 10, and the decoding apparatus 10A for performing the decoding operation as well as a computer program executed in the encoding apparatus 50 for performing the encoding operation contains a module for each of the respective constituent elements to be implemented in a computer. In practice, for example, the CPU 80 reads the computer programs from the corresponding ROM 82 and runs them such that the computer programs are loaded in a main memory device. As a result, the module for each constituent element is generated in the main memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding apparatus comprising:
   a clipper configured to clip pieces of encoded data each having a predetermined first code length from input data encoded with variable-length encoding, the predetermined first code length being greater than or equal to a maximum code length among a plurality of pieces of encoded data included in the input data; and
   a decoder configured to decode the clipped pieces of encoded data by using variable-length decoding.

2. The apparatus according to claim 1, wherein
   the clipper is configured to store the clipped pieces of encoded data as pieces of stored data in a storage, and
   the decoder is configured to decode the clipped pieces of stored data stored in the storage by using variable-length decoding.

3. The apparatus according to claim 2, wherein
   the decoder is configured to determine whether variable-length decoding based on each piece of stored data can be performed, and
   the clipper is configured to stop the clipping from the input data when the decoder determines that the variable-length decoding can be performed.

4. The apparatus according to claim 2, wherein the storage has a storage capacity greater than or equal to a subtraction value obtained by subtracting a minimum code length of the plurality of pieces of encoded data from a value twice as large as the first code length.

5. The apparatus according to claim 1, wherein
   the input data contains a plurality of types of encoded data with different maximum code lengths, and
   the decoder is configured to decode at least one of the plurality of types of encoded data and a type other than the at least one type by using variable-length decoding in parallel.

6. An encoding apparatus comprising:
   an encoder configured to encode encoding target information by using variable-length encoding; and
   a joiner configured to join a plurality of pieces of encoded data obtained by the variable-length encoding such that each piece of joined data has a predetermined first code length, the predetermined first code length being greater than or equal to a maximum code length of the plurality of pieces of encoded data, and output the pieces of joined data.

7. The apparatus according to claim 6, wherein
   the encoder includes
      a first encoder configured to encode first data included in the encoding target information by using variable-length encoding, and
      a second encoder configured to encode second data included in the encoding target information by using variable-length encoding, a maximum code length of the second data being greater than a maximum code length of the first data, and
   the joiner is configured to alternately output first joined data and second joined data, the first joined data being obtained by joining a plurality of pieces of encoded data of a first type obtained by variable-length encoding on the first data such that the first joined data has the predetermined first code length, the second joined data being obtained by joining one or more pieces of encoded data of a first type obtained by variable-length encoding on the second data such that the first joined data has the predetermined first code length.

8. A decoding method comprising:
clipping pieces of encoded data each having a predetermined first code length from input data encoded with variable-length encoding, the predetermined first code length being greater than or equal to a maximum code length among a plurality of pieces of encoded data included in the input data; and
decoding the clipped pieces of encoded data by using variable-length decoding.

9. The decoding method according to claim 8, wherein
the clipping stores the clipped pieces of encoded data as pieces of stored data in a storage, and
the decoding decodes the clipped pieces of stored data stored in the storage by using variable-length decoding.

10. The decoding method according to claim 9, wherein
the decoding determines whether variable-length decoding based on each piece of stored data can be performed; and
the clipping stops the clipping from the input data when it is determined that the variable-length decoding can be performed.

11. The decoding method according to claim 9, wherein the storage has a storage capacity greater than or equal to a subtraction value obtained by subtracting a minimum code length of the plurality of pieces of encoded data from a value twice as large as the first code length.

12. The decoding method according to claim 8, wherein
the input data contains a plurality of types of encoded data with different maximum code lengths, and
the decoding decodes at least one of the plurality of types of encoded data and a type other than the at least one type by using variable-length decoding in parallel.

13. A decoding apparatus comprising:
a processor configured to:
clip pieces of encoded data each having a predetermined first code length from input data encoded with variable-length encoding, the predetermined first code length being greater than or equal to a maximum code length among a plurality of pieces of encoded data included in the input data; and
decode the clipped pieces of encoded data by using variable-length decoding.

14. The decoding apparatus according to claim 13, wherein the processor is configured to:
store the clipped pieces of encoded data as pieces of stored data in a storage, and
decode the clipped pieces of stored data stored in the storage by using variable-length decoding.

15. The decoding apparatus according to claim 14, wherein the processor is configured to:
determine whether variable-length decoding based on each piece of stored data can be performed; and
stop the clipping from the input data when it is determined that the variable-length decoding can be performed.

16. The decoding apparatus according to claim 14, wherein the storage has a storage capacity greater than or equal to a subtraction value obtained by subtracting a minimum code length of the plurality of pieces of encoded data from a value twice as large as the first code length.

17. The decoding apparatus according to claim 13, wherein
the input data contains a plurality of types of encoded data with different maximum code lengths, and
the processor is configured to decode at least one of the plurality of types of encoded data and a type other than the at least one type by using variable-length decoding in parallel.

* * * * *